United States Patent
Nazarian

(10) Patent No.: US 7,203,092 B2
(45) Date of Patent: Apr. 10, 2007

(54) FLASH MEMORY ARRAY USING ADJACENT BIT LINE AS SOURCE

(75) Inventor: Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 11/127,466

(22) Filed: May 12, 2005

(65) Prior Publication Data

US 2006/0256618 A1    Nov. 16, 2006

(51) Int. Cl.
 *G11C 16/04*    (2006.01)
(52) U.S. Cl. .......................... 365/185.17; 365/185.11; 365/185.19
(58) Field of Classification Search .......... 365/185.17, 365/185.11, 185.19
 See application file for complete search history.

(56) References Cited

U.S. PATENT DOCUMENTS

| | | | |
|---|---|---|---|
| 5,898,616 A * | 4/1999 | Ono | 365/185.17 |
| 5,920,503 A | 7/1999 | Lee et al. | |
| 6,028,788 A * | 2/2000 | Choi et al. | 365/185.11 |
| 6,519,181 B2 | 2/2003 | Jeong | |
| 6,654,294 B2 | 11/2003 | Jeong | |

* cited by examiner

*Primary Examiner*—Huan Hoang

(74) *Attorney, Agent, or Firm*—Leffert Jay & Polglaze, P.A.

(57) ABSTRACT

A memory array having a plurality of flash memory cells arranged in rows and columns. A plurality of bit lines couple the columns such that alternate bit lines of the plurality of bit lines are adapted to operate as either source lines or bit lines in response to bit line selection and biasing.

28 Claims, 8 Drawing Sheets

FLASH MEMORY ARRAY USING ADJACENT BIT LINE AS SOURCE

TECHNICAL FIELD OF THE INVENTION

The present invention relates generally to memory devices and in particular the present invention relates to flash memory device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

FIG. 1 illustrates a simplified diagram of one embodiment for a portion of a typical prior art NAND flash memory array. The memory array of FIG. 1, for purposes of clarity, does not show all of the elements typically required in a memory array. For example, only two bit lines are shown (BL1 and BL2) when the number of bit lines required actually depends upon the memory density. The bit lines are subsequently referred to as (BL1–BLN).

The array is comprised of an array of floating gate cells 101 arranged in series columns 104, 105. Each of the floating gate cells 101 are coupled drain to source in each series chain 104, 105. A word line (WL0–WL31) that spans across multiple series strings 104, 105 is coupled to the control gates of every floating gate cell in a row in order to control their operation. The bit lines (BL1–BLN) are eventually coupled to sense amplifiers (not shown) that detect the state of each cell.

In operation, the word lines (WL0–WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1–BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

During a typical prior art programming operation, the selected word line for the flash memory cell to be programmed is biased with a series of incrementing voltage programming pulses that start at an initial voltage that is greater than a predetermined programming voltage (e.g., approximately 16V). After each programming pulse, a verification operation with a word line voltage of 0V is performed to determine if the cell's threshold voltage $V_t$ has increased to the properly programmed level (e.g., 0.5V).

The unselected word lines for the remaining cells are typically biased at a voltage that is less than the programming voltage (e.g., approximately 10V) during the program operation. In one embodiment, the unselected word line voltages can be any voltage above ground potential. Each of the memory cells is programmed in a substantially similar fashion.

One problem with the prior art flash memory array architecture is the large amount of current that is conducted by the source lines of the array. Typically, 2048 memory cells are on each word line and are read simultaneously when the word line is selected. A common source line has to conduct the current of all of these memory cells. This increases the noise experienced by the memory cells of the array.

Additionally, in order for the shared source line to carry such a large current, it must be made relatively large in comparison to other elements of the array. Therefore, even though most of the elements of the array can be scaled to increase the density of the memory device, the shared source line needs to remain relatively large to carry the large amounts of current during read and verify operations. The source line thus limits the scaling possible for a flash memory array.

For the reasons stated above, and for other reasons stated below which will become apparent to those skilled in the art upon reading and understanding the present specification, there is a need in the art for a memory array that generates less noise and can be more readily scaled.

SUMMARY

The above-mentioned problems with flash memory devices and other problems are addressed by the present invention and will be understood by reading and studying the following specification.

The present invention encompasses a memory array comprising a plurality of flash memory cells arranged in rows and columns. A plurality of bit lines are coupled to the columns such that alternate bit lines of the plurality of bit lines can operate as either source lines or bit lines in response to bit line selection biasing. The common nodes between serially connected select transistors in a column are coupled to different bit lines. In one embodiment, during a read operation, the selected bit lines are biased at $V_{CC}$ and the bit lines that are to act as source lines are biased at ground potential.

Further embodiments of the invention include methods and apparatus of varying scope.

DETAILED DESCRIPTION

Figure 1:
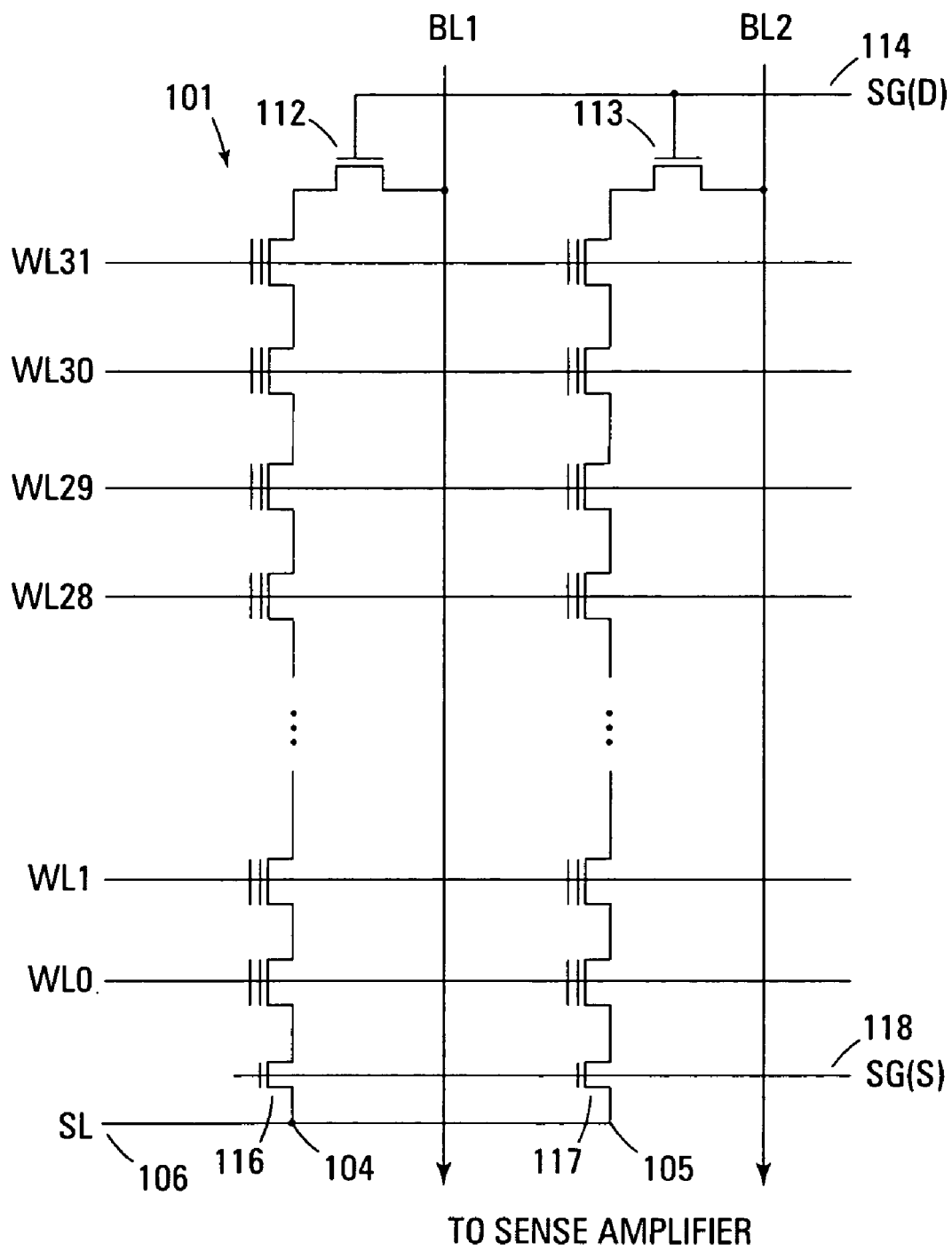
FIG. 1 shows a simplified schematic diagram of a typical prior art NAND flash memory array of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

The subsequent discussion of the present invention is to a NAND architecture array. The embodiments of the present invention, however, are not limited to any one type of array architecture. For example, the present invention may also operate in NOR, AND, or other architectures.

Figure 2:
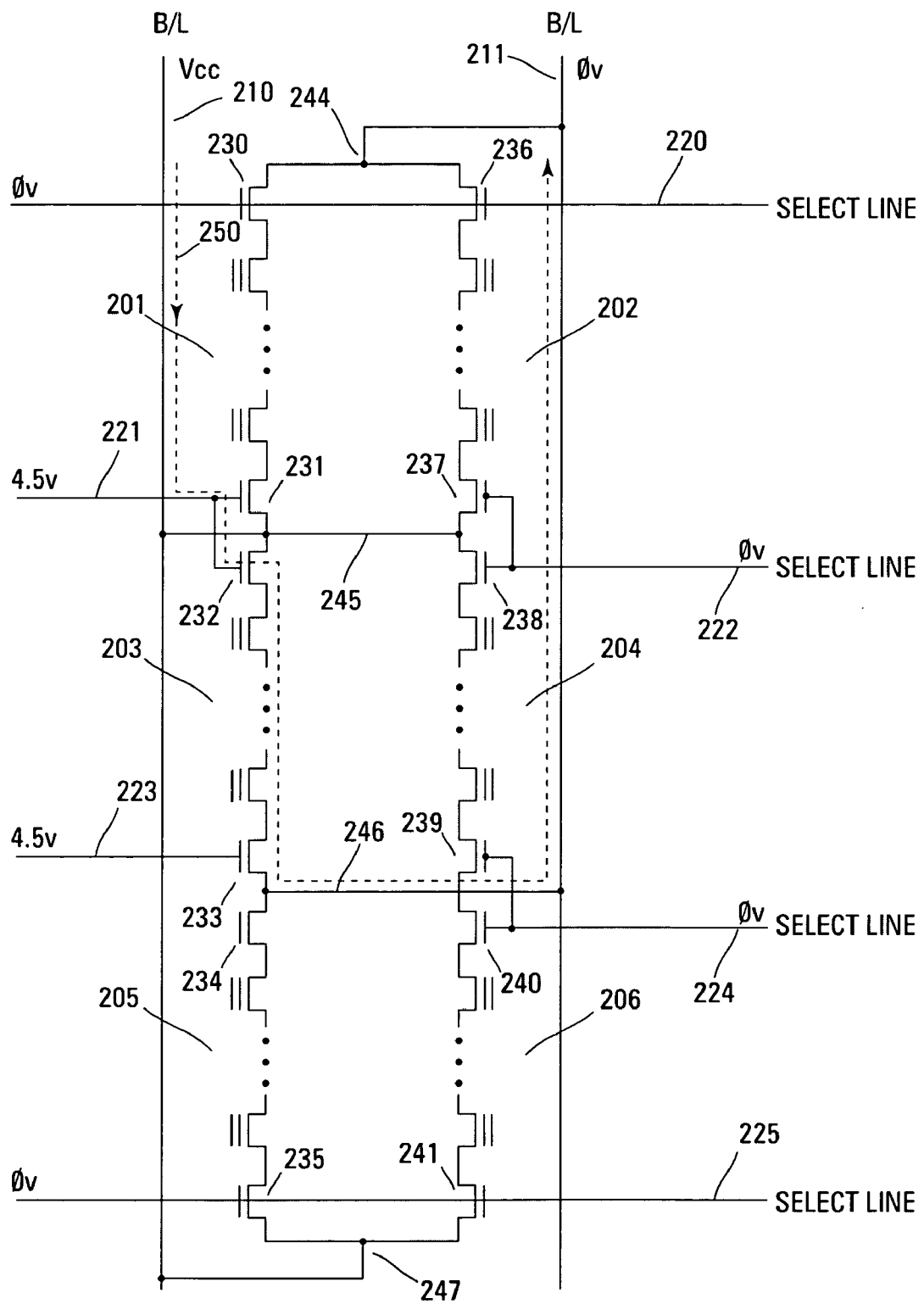
FIG. 2 shows a simplified schematic diagram of one embodiment of a NAND flash memory array of the present invention.

FIG. 2 illustrates a simplified schematic diagram of one embodiment of a portion of a NAND flash memory array of the present invention. In the interest of clarity, this figure shows only a small portion of a much larger memory array.

The NAND flash memory array is comprised of a plurality of flash memory strings 201–206 in which the cells of each string are enabled/disabled substantially simultaneously. Each series connected string of memory cells is, in one embodiment, comprised of 32 cells each capable of storing one or more bits of data on a floating gate. Alternate embodiments may have different quantities of flash memory cells in the string.

Each string of cells 201–206 is selected and deselected by select transistors 230–241 on either end of the series string 201–206. For example, one series string of flash cells 201 has a top select transistor 230 and a bottom select transistor 231. The series strings 201–206 of each column are coupled together by a common node coupling the source of the bottom select transistor 231, 233, 237, 239 with the drain of the top select transistor 232, 234, 238, 240 of the next series string 201–206 in the column.

The select transistors are turned on and off by the biasing of their control gates that are connected to select lines 220–225. For purposes of clarity, some of the select lines 221–224 are shown as terminating at the select transistors. However, these select lines 221–224 actually continue on to connect to alternate bit line select transistors in the memory array.

In the embodiment of FIG. 2, instead of a normal source line connected to the bottom of each series string of flash memory cells 201–206, the series memory strings 201–206 are connected 245, 246, at the common node between select transistors, to adjacent bit lines 210, 211 for use as the source pull-down. This provides every series memory string 201–206 with its own dedicated ground ("source line") through the adjacent bit line since only alternate bit lines of the memory array are selected during a program or read operation.

As an example of operation, the left bit line 210 is selected (i.e., biased at $V_{CC}$) as a bitline for one of the left flash memory cell series strings 203. The right bit line 211 is biased at 0V. The right bit line 211 is therefore going to be used as the source line for the series of memory cells 203. Current flow 250, illustrated as a dotted line, goes through the left bit line 210, through the top select transistor 232 of the selected series 203, down through the string of memory cells 203, over the connection 246 to the right bit line 211, and up through the right bit line 211. Other selected memory cell strings 201, 202, 204–206 operate in a substantially similar manner in that one bit line is selected while the adjacent, deselected bit line is used as the source line.

A plurality of bit lines 210, 211 are run vertically through the memory array. These are the lines 210, 211 that are used alternately as bit lines and source lines, depending on which series string of memory cells 201–206 is enabled.

Figure 3:
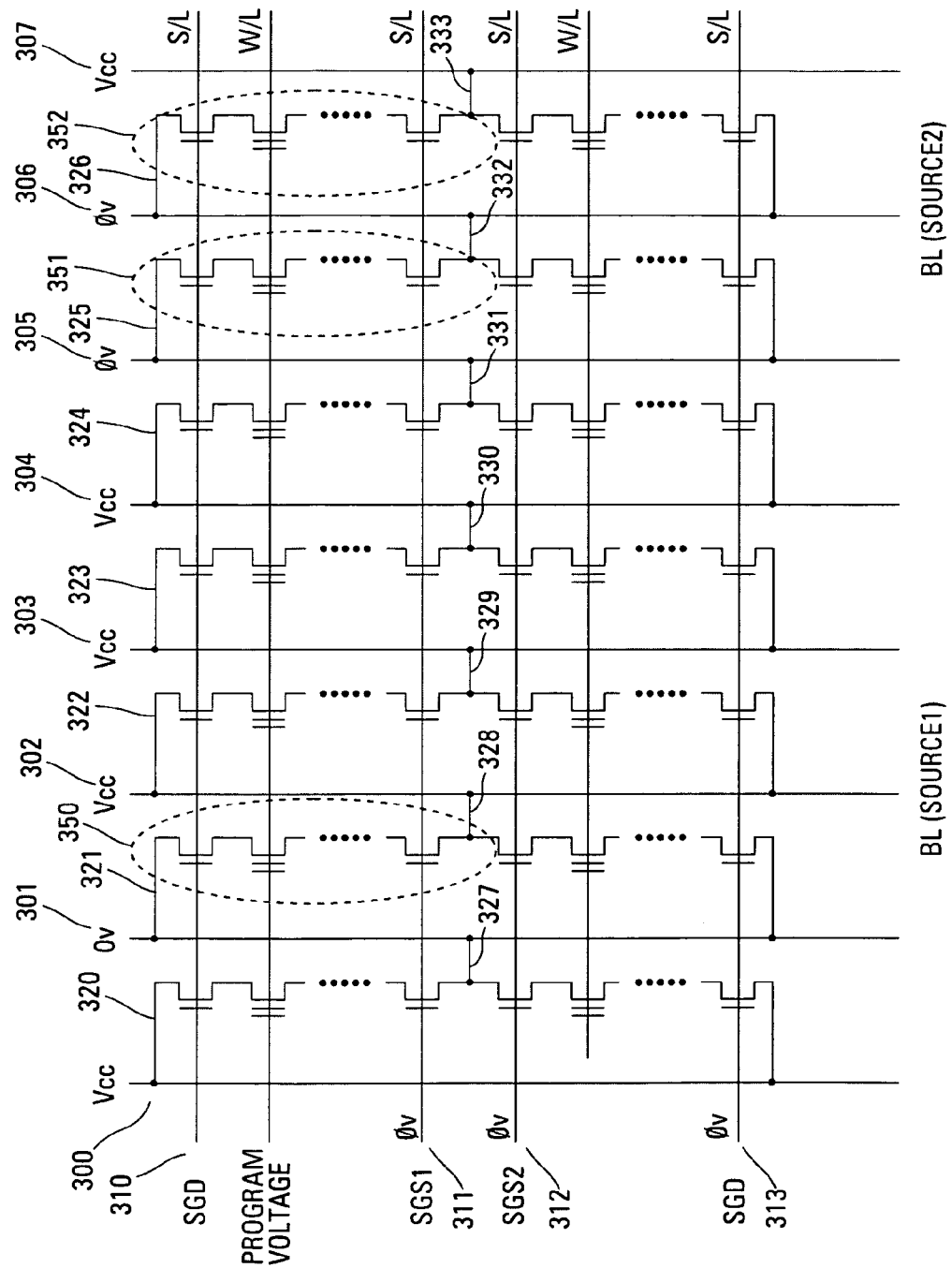
FIG. 3 shows a simplified schematic diagram of an alternate embodiment of a NAND flash memory array of the present invention during a programming operation.
Figure 5:
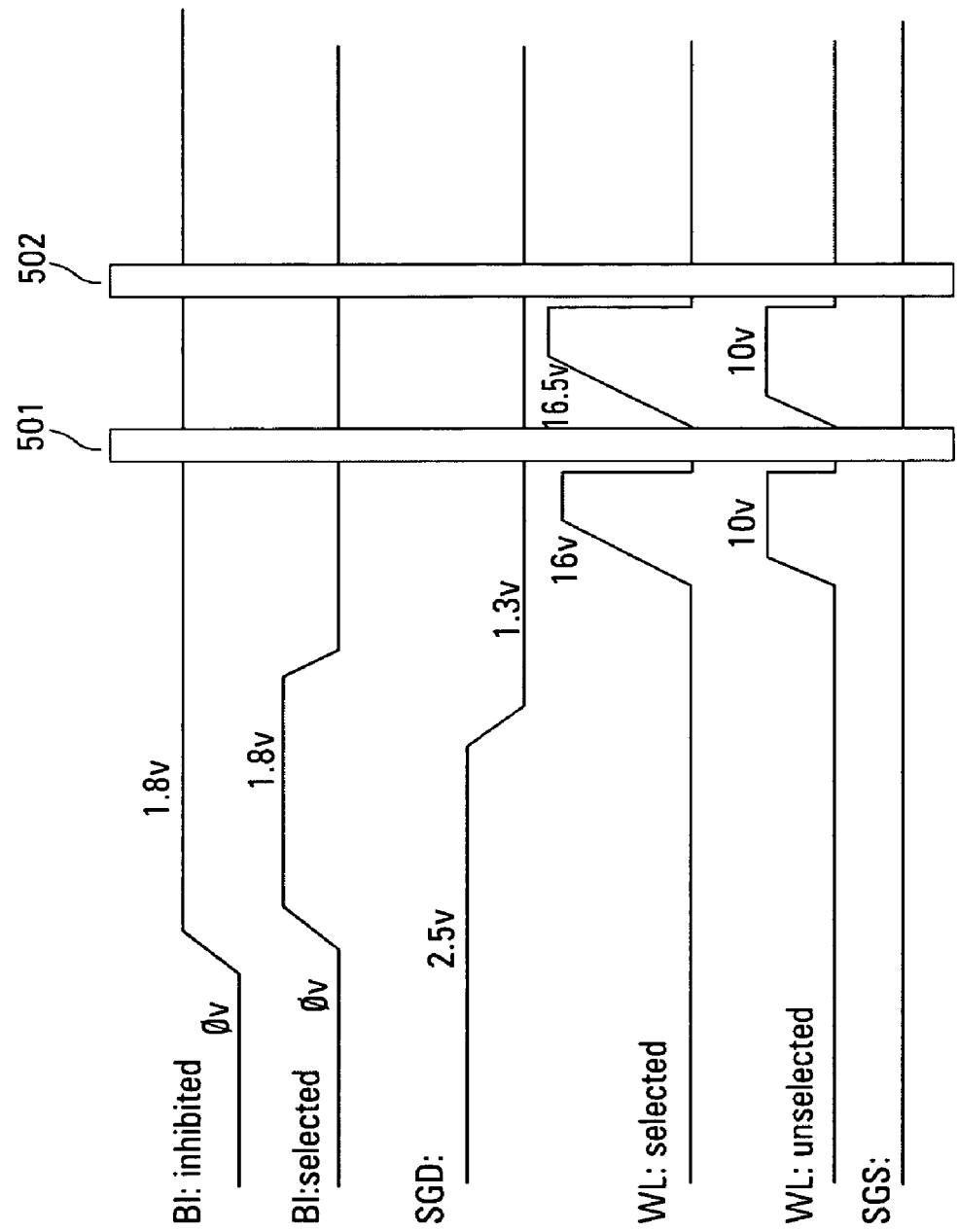
FIG. 5 shows a timing diagram of one embodiment of a programming operation of the present invention in accordance with the circuit of FIG. 3.

FIG. 3 illustrates a simplified schematic diagram of an alternate embodiment of a NAND flash memory array of the present invention during a programming operation. In this embodiment, the array is comprised of a plurality of vertical bit lines 300–307 that are used as either bit lines or source lines, depending on which series of memory cells are being accessed. In the exampled illustrated in FIG. 3, three of the series connected flash memory cells 350–352 are being programmed while the remainder are being inhibited. The timing diagram of a programming method of the present invention is illustrated in FIG. 5 and described subsequently.

The ends of each series of flash memory cells are connected to alternate bit lines to act as either bit lines or source lines. In this embodiment, one end of each series of memory cells is connected 320–326 to the left bit line 300–306. The other end of each series of memory cells is connected to the right bit lines 301–307 to act as the source lines when their respective series of memory cells are accessed. Alternate embodiments may reverse these connections.

Select lines 310–313 run horizontally through the array connecting each of their respective select transistors. As in other embodiments and as is well known in the art, the select lines selectively enable or disable the select transistors to allow or inhibit access to each series of flash memory cells.

During the programming operation of FIG. 3, the enabled bit lines 301, 302, 305, 306 are biased at 0V while the inhibited bit lines 300, 302–304, 307 are biased at $V_{CC}$ or some other voltage. The top select line 310 is initially biased at one voltage that is then reduced to a second, lower voltage during the programming operation. In one embodiment, the initial voltage of the select line is 2.5V as a precharge voltage and the second, lower voltage is 1.3V to trap the bit line precharge voltage in the NAND string before programming. However, the present invention is not limited to any particular voltages.

The word lines of the flash memory cells being programmed are biased with a series of high voltage pulses. The voltage levels and the quantity of programming pulses required may be different for different embodiments. The remaining word lines of rows not being programmed may be left floating.

Figure 4:
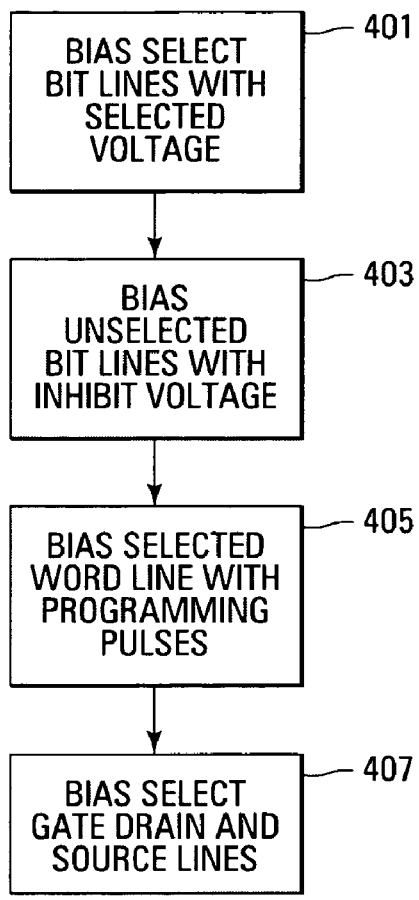
FIG. 4 shows a flowchart of one embodiment of a programming operation of the present invention in accordance with the circuit of FIG. 3.

FIG. 4 illustrates a flowchart of one embodiment of a method for programming the memory array of FIG. 3 that uses an adjacent bit line as a source. This method biases the selected bit lines with a select voltage 401. In one embodiment, this voltage is 0V. The present invention, however, is not limited to any one select voltage.

The unselected bit lines are biased with an inhibit voltage 403. In one embodiment, this voltage is $V_{CC}$ even though the present invention is not limited to any one voltage.

The selected word line that is coupled to the cells to be programmed is biased with a plurality of programming pulses 405. In one embodiment, the programming pulses start at a first predetermined programming voltage and incrementally increase until either the cells are programmed or an error occurs.

The select gate drain and source lines are biased as required 407. For example, if the select gate drain line is coupled to the series strings of the cells being programmed, that select line is biased initially at one voltage that is then reduced to a second voltage. As described previously, the initial voltage can be 2.5V and the second voltage can be 1.3V. The remaining select gate drain and source lines are biased at some lower voltage such as 0V.

FIG. 5 illustrates a timing diagram of the programming operation of the present invention in accordance with the circuit of FIG. 3. The timing diagram shows that the inhibited bit lines are biased at $V_{CC}$. In this embodiment, that voltage is 1.8V. Alternate embodiments can use other voltages. The selected bit lines are initially biased at $V_{CC}$ then biased at 0V for the programming operation. SGD goes from 2.5V to 1.3V during this time to trap the precharge voltage in the NAND string.

The selected word line is shown as having a 16V programming pulse while the unselected word lines get a pulse with a smaller voltage, such as 10V. A read/verify operation 501 is then performed. If the cells verified as erased still, a second pulse is generated on the selected word lines. For purposes of illustration, the second pulse is 16.5V. The read/verify operations 502 are repeated until programming is confirmed.

Figure 6:
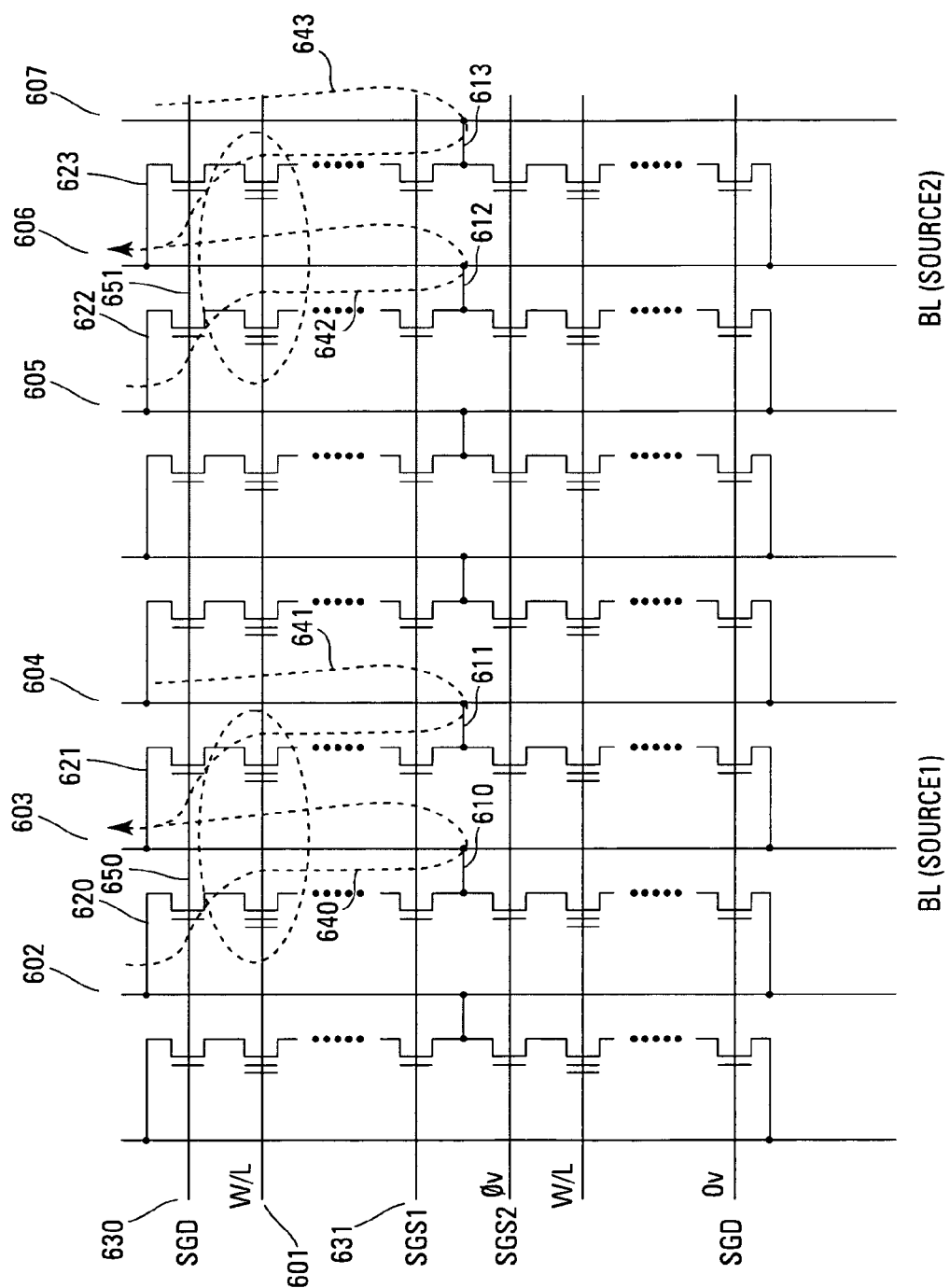
FIG. 6 shows a simplified schematic diagram of an alternate embodiment of a NAND flash memory array of the present invention during a read operation.
Figure 8:
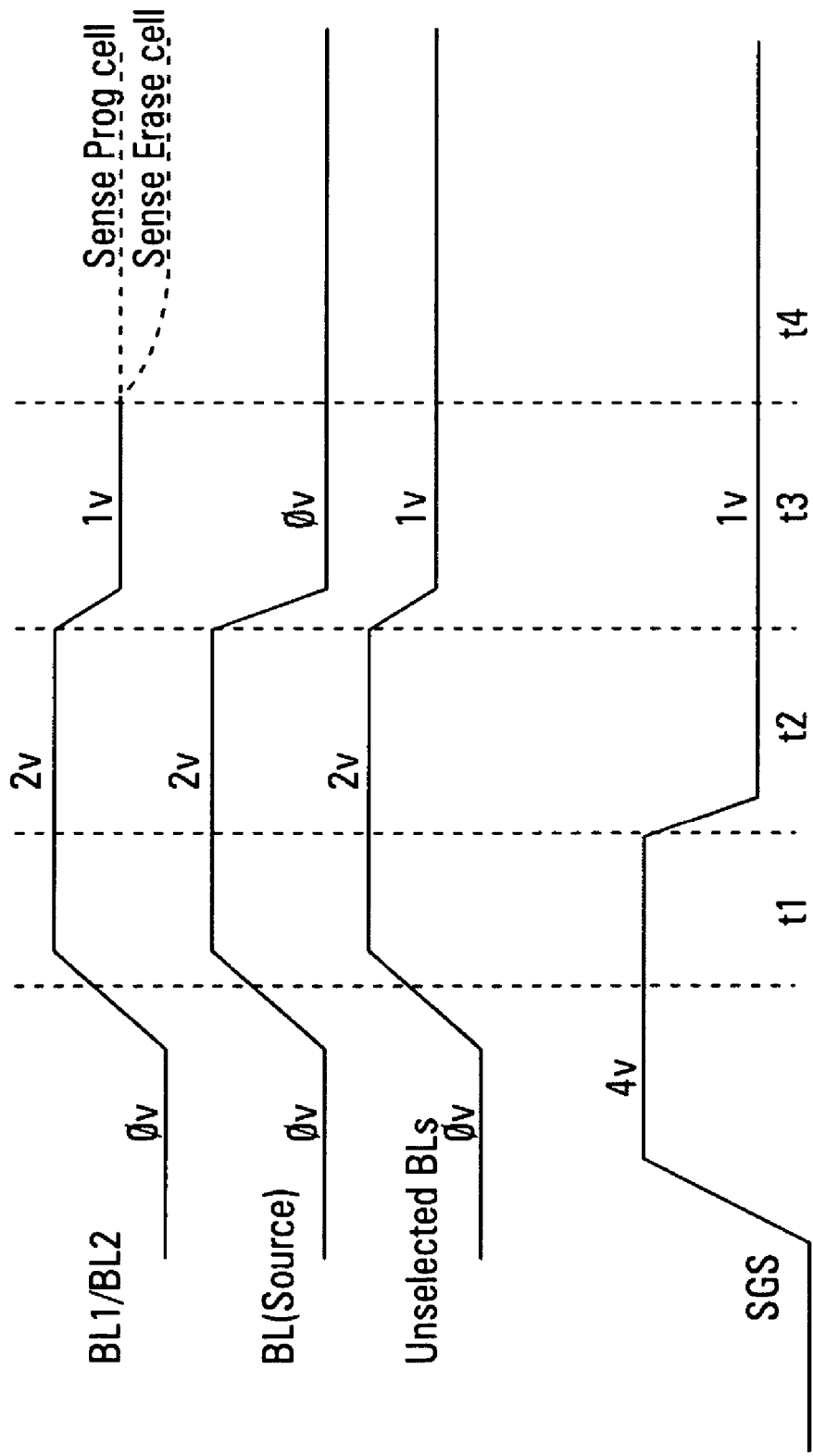
FIG. 8 shows a timing diagram of one embodiment of a read operation of the present invention in accordance with the circuit of FIG. 6.

FIG. 6 illustrates a simplified schematic diagram of the alternate embodiment during a read operation. In this embodiment, two bit lines 603, 606 are shown that act as source lines. The first bit line 603 acts as a source line for the series strings of memory cells 620, 621 on either side. These series strings 620, 621 use bit lines 602, 604, respectively. Similarly, the other series strings 622, 623 of memory cells to be read use the bit line 606 between the two bit lines 605, 607 as the source line. Two groups of cells 650, 651 are shown as being read. The timing waveforms for the read operation of this embodiment is illustrated in FIG. 8 and discussed subsequently.

In this embodiment, one string 620 is read from the top down while the string 621 on the other side of the acting source line 603 is read from the bottom up. In the first case, the current 640 is shown flowing from the bit line 602, through the series string of flash memory cells 620, through the connection 610 to the acting source line 603, and through the acting source line 603 to ground. Similarly, the current 641 for the second of the series strings of memory cells flows from the string's bit line 604, through the connection 611 to the series string 621, up through the string of memory cells 621 to the acting source line 603.

The read operation of the other series strings of memory cells 622, 623 is performed in a substantially similar manner. The current for the left string of memory cells 622 flows from its bit line 605, through the series of memory cells 622, through the connection 612 between the string of cells 622 and the acting source line 606, and through the acting source line 606 to ground. The current for the right string of memory cells 623 flows through its bit line 607, through the connection 613 between the bit line 607 and the string of memory cells 623, up through the series string of memory cells 623, and to the acting source line 606 to ground.

The select lines 630, 631 that are connected to the select transistors for each of the enabled series strings of memory cells are biased at some low voltage like 1V. Alternate embodiments can use other low voltages. The word lines 601 for each of the selected rows is biased at ground potential in this embodiment. These voltages are for purposes of illustration only since the present invention is not limited to any voltage levels.

Figure 7:
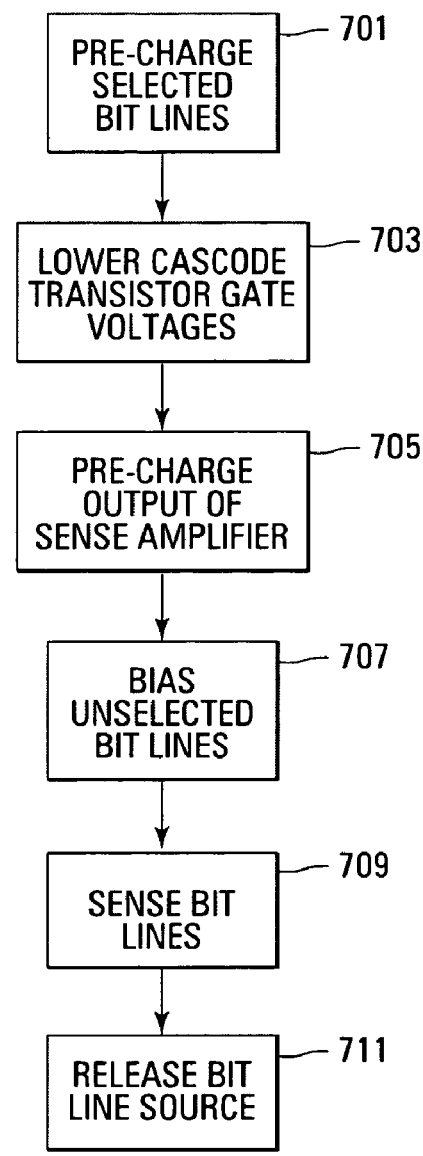
FIG. 7 shows a flowchart of one embodiment of a read operation of the present invention in accordance with the circuit of FIG. 6.

FIG. 7 illustrates a flowchart of one embodiment of a method for reading the memory array of FIG. 4 that uses an adjacent bit line as a source. The selected bit lines are pre-charged to a predetermined voltage 701. In one embodiment, this voltage is 1.3V. Alternate embodiments can use other voltages.

The gate voltage of the cascode transistors (i.e., SGS1 of FIG. 3) is lowered to trap the predetermined voltage precharge 703. In one embodiment, the gate voltage is lowered from 4.5V to 1V. Alternate embodiments can use other voltages. The output of the sense amplifier is then pre-charged to $V_{CC}$ 705.

The unselected bit lines are biased at some low voltage 707, such as 1V, to shut down the sneak path current to adjacent unselected strings given the 1.5V on the SGS and SGD gates. The selected bit lines are then sensed by the sense amplifier 709 after which the bit line acting as the source line is then released 711.

FIG. 8 illustrates a timing diagram of one embodiment of the read operation of the present invention in accordance with the circuit of FIG. 4. The diagram shows that at time $t_1$, the channel is pre-charged. In the embodiment of FIG. 4, bit lines 402 and 404 are selected. Therefore, the timing diagram shows that these bit lines are biased at 2V to pre-charge the bit lines. Also during the $t_1$ time period, the bit line that acts as the source line, BL(source1), as well as the unselected bit lines are biased at 2V. The select gate source line (SGS1 in FIG. 4) is biased at 4V.

At time $t_2$, the pre-charged voltage is trapped in the NAND string. This is accomplished by reducing the select gate source bias to 1V.

At time $t_3$, the bit lines are prepared for sensing. This is accomplished by reducing the selected bit line biasing to 1V. Substantially simultaneously the BL(source) is reduced to 0V and the unselected bit lines are reduced to a 1V bias. The select gate source (SGS1) is biased at 1V.

At time $t_4$, the selected bit lines are sensed by the sense amplifier. The bit line acting as the source line is then released.

Figure 9:
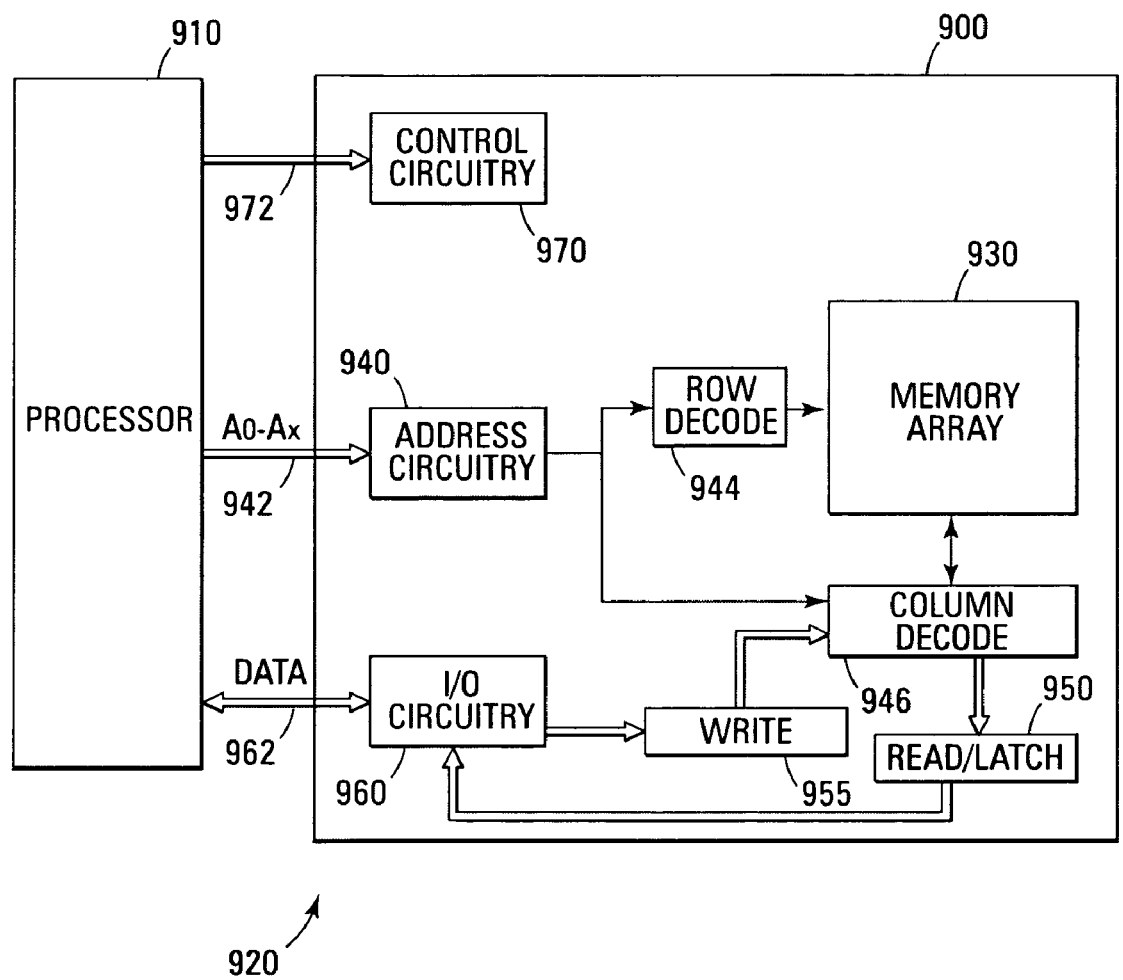
FIG. 9 shows a block diagram of one embodiment of an electronic system of the present invention.

FIG. 9 illustrates a functional block diagram of a memory device 900 of one embodiment of the present invention that is coupled to a processor 910. The processor 910 may be a microprocessor, a processor, or some other type of controlling circuitry. The memory device 900 and the processor 910 form part of an electronic system 920. The memory device 900 has been simplified to focus on features of the memory that are helpful in understanding the present invention.

The memory device includes an array of memory cells 930. In one embodiment, the memory cells are non-volatile floating-gate memory cells and the memory array 930 is arranged in banks of rows and columns.

An address buffer circuit 940 is provided to latch address signals provided on address input connections A0–Ax 942. Address signals are received and decoded by a row decoder 944 and a column decoder 946 to access the memory array 930. It will be appreciated by those skilled in the art, with the benefit of the present description, that the number of address input connections depends on the density and architecture of the memory array 930. That is, the number of addresses increases with both increased memory cell counts and increased bank and block counts.

The memory device 900 reads data in the memory array 930 by sensing voltage or current changes in the memory array columns using sense/latch circuitry 950. The sense/latch circuitry, in one embodiment, is coupled to read and latch a row of data from the memory array 930. Data input and output buffer circuitry 960 is included for bi-directional data communication over a plurality of data connections 962 with the controller 910). Write circuitry 955 is provided to write data to the memory array.

Control circuitry 970 decodes signals provided on control connections 972 from the processor 910. These signals are used to control the operations on the memory array 930, including data read, data write, and erase operations. In one embodiment, the control circuitry 970 executes the embodiments of the flash memory array 930 methods of the present invention. The control circuitry 970 may be a state machine, a sequencer, or some other type of controller.

The flash memory device illustrated in FIG. 9 has been simplified to facilitate a basic understanding of the features of the memory. A more detailed understanding of internal circuitry and functions of flash memories are known to those skilled in the art.

CONCLUSION

In summary, the embodiments of the present invention provide a dedicated ground to alternate bit lines of memory cells through an adjacent bit line. The adjacent bit line can act as either a bit line or a source line, depending on which strings of memory cells are enabled for access. This reduces the noise experienced by the memory cells due to large amounts of current flowing through the prior art source line. Additionally, valuable real estate on the die is saved since the relatively large source lines are no longer required.

The embodiments of the present invention are not limited to any one type of memory technology. For example, the circuits and methods of the present invention may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory array comprising:
a plurality of non-volatile memory cells arranged in rows and columns wherein each column of memory cells is arranged in a plurality of series strings of memory cells, each series string having a top select transistor and a bottom select transistor; and
a plurality of bit lines coupling the columns such that alternate bit lines of the plurality of bit lines are adapted to operate as either source lines or bit lines in response to bit line selection wherein none of the top select transistors of adjacent series strings are coupled to the same bit line.

2. The memory array of claim 1 wherein the alternate bit lines operate as source lines during predetermined memory operations.

3. The memory array of claim 2 wherein none of the bottom select transistors of adjacent series strings are coupled to the same bit line.

4. The memory array of claim 1 wherein select lines are coupled to control gates of alternate bottom select transistors.

5. A NAND flash memory array comprising:
a plurality of flash memory cells arranged in rows and columns, each column of memory cells comprising a plurality of subsets of series coupled flash memory cells, each subset having a top select transistor and a bottom select transistor;
a plurality of word lines coupling the rows; and
a plurality of bit lines coupling the columns wherein none of the top select transistors of adjacent subsets of series coupled flash memory cells in different columns are coupled to the same bit line and non of the bottom select transistors of adjacent subsets of series coupled flash memory cells in different columns are coupled to the same bit line.

6. The memory array of claim 5 wherein control gates of the top select transistors of each column are coupled together into top rows and the bottom select transistors of each column are coupled together into bottom rows.

7. The memory array of claim 5 wherein a control gate of a bottom select transistor is coupled to a control gate of an adjacent top select transistor in each column.

8. The memory array of claim 5 wherein a bottom select transistor of a first subset of series coupled flash memory cells in a first column is coupled to a top select transistor of a second subset of series coupled flash memory cells in the first column.

9. The memory array of claim 5 wherein subset is comprised of 32 flash memory cells connected in a series configuration between the top and the bottom select transistors.

10. A non-volatile memory device comprising:
memory control circuit that controls operations of the memory device; and
a flash memory array comprising:
a plurality of flash memory cells arranged in rows and columns wherein each column of memory cells is arranged in a plurality of series strings of memory cells, each series string having a top select transistor and a bottom select transistor; and
a plurality of bit lines coupling the columns such that alternate bit lines of the plurality of bit lines are adapted to operate as either source lines or bit lines in response to bit line selection wherein the top select transistor of a first series string is coupled to a first bit line and the bottom select transistor of the first series string is coupled to a second bit line that is adjacent to the first bit line such that each of the top select transistors of adjacent series strings are coupled to different bit lines.

11. The device of claim 10 wherein unselected bit lines that are biased at ground potential operate as source lines.

12. The device of claim 10 wherein the columns are comprised of a plurality of subsets of series coupled flash memory cells, each subset having a top select transistor and a bottom select transistor such that adjacent column select transistors at the top and bottom of each column are coupled in rows.

13. The device of claim 10 wherein the columns are comprised of a plurality of subsets of series coupled flash memory cells, each subset having a top select transistor and a bottom select transistor such that a first bottom select transistor of a first subset is coupled serially at a common node to a first top select transistor of an adjacent subset and a control gate of the first bottom select transistor is coupled to a control gate of the first top select transistor.

14. The device of claim 13 wherein a select line couples rows of control gates of serially coupled select transistors in alternate columns.

15. The device of claim 13 wherein common nodes between serially coupled select transistors of a column are coupled in an alternate fashion to one of a first bit line or an adjacent bit line.

16. The device of claim 13 wherein a first common node of a first and a second adjacent column are coupled to a first bit line and a second common node of the first and second adjacent column are coupled to a second bit line that is adjacent to the first bit line.

17. An electronic system comprising:
a processor that generates memory control signals; and
a memory device coupled to the processor, the device comprising:
  a memory array having a plurality of flash memory cells arranged in rows and columns wherein each column of memory cells is arranged in a plurality of series strings of memory cells, each series string having a top select transistor and a bottom select transistor; and
  a plurality of bit lines coupling the columns such that alternate bit lines of the plurality of bit lines are adapted to operate as either source lines or bit lines in response to bit line selection wherein each of the bottom select transistors of adjacent series strings are coupled to different bit lines.

18. A method for programming a memory array that includes a plurality of bit lines coupling series strings of memory cells such that alternate bit lines act as source lines such that each series string has a top select transistor and a bottom select transistor wherein each of the bottom select transistors of adjacent series strings are coupled to different bit lines, the method comprising:

biasing selected bit lines with a select voltage such that the selected bit line acts as a source line;
biasing unselected bit line with an inhibit voltage;
biasing selected word lines with at least one programming voltage; and
biasing a select gate drain line at a first voltage at a first time and a second voltage at a second time.

19. The method of claim 18 and further including biasing remaining select gate drain lines and select gate source lines at ground potential.

20. The method of claim 18 wherein biasing the selected word lines includes applying a series of programming pulses that start at a first programming voltage and increase at a predetermined incremental voltage.

21. The method of claim 18 wherein the select voltage is 0V and the inhibit voltage is $V_{CC}$.

22. The method of claim 20 wherein the incremental voltage is 0.5V.

23. The method of claim 20 and further including performing a verify operation between each programming pulse.

24. A method for reading a memory array that includes a plurality of bit lines coupling series strings of memory cells such that alternate bit lines act as source lines such that each series string has a top select transistor and a bottom select transistor wherein each of the bottom select transistors of adjacent series strings are not coupled to the same bit line, the method comprising:
pre-charging selected bit lines to a pre-charge voltage;
biasing a select gate source line and a select gate drain line;
biasing the alternate bit lines at a predetermined voltage such that they act as source lines;
sensing the selected bit lines; and
releasing the bit lines that act as source lines.

25. The method of claim 24 and further including pre-charging an output of a sense amplifier.

26. The method of claim 24 wherein the predetermined voltage is 0V.

27. The method of claim 24 wherein the pre-charge voltage is 2V.

28. The method of claim 24 wherein the select gate drain line is biased at 4.5V and the select gate source line is biased at 1V.

* * * * *

UNITED STATES PATENT AND TRADEMARK OFFICE
CERTIFICATE OF CORRECTION

| | | |
|---|---|---|
| PATENT NO. | : 7,203,092 B2 | Page 1 of 1 |
| APPLICATION NO. | : 11/127466 | |
| DATED | : April 10, 2007 | |
| INVENTOR(S) | : Hagop A. Nazarian | |

It is certified that error appears in the above-identified patent and that said Letters Patent is hereby corrected as shown below:

Column 4, line 47, replace "lines 301, 302, 305, 306 are" with --lines 301, 305, 306 are--.
Column 6, lines 32, 33 and 39, replace each occurrence of "Fig. 4" with --Fig. 6--.
Column 6, line 34, replace "lines 402 and 404 are" with --lines 602 and 604 are--.
Column 7, line 13, replace "controller 910)." with --controller 910.--.

Signed and Sealed this

Fourth Day of December, 2007

JON W. DUDAS
*Director of the United States Patent and Trademark Office*